United States Patent
Bhagwat et al.

(10) Patent No.: US 10,127,126 B2
(45) Date of Patent: Nov. 13, 2018

(54) RAPID SYSTEM DEBUGGING USING FINITE STATE MACHINES

(71) Applicant: SEAGATE TECHNOLOGY LLC, Cupertino, CA (US)

(72) Inventors: Rajesh Maruti Bhagwat, Pune (IN); Nitin Satishchandra Kabra, Pune (IN)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 84 days.

(21) Appl. No.: 15/154,839

(22) Filed: May 13, 2016

(65) Prior Publication Data

US 2017/0329686 A1    Nov. 16, 2017

(51) Int. Cl.
| | |
|---|---|
| G06F 11/00 | (2006.01) |
| G06F 11/26 | (2006.01) |
| G06F 1/10 | (2006.01) |
| G06F 13/24 | (2006.01) |

(52) U.S. Cl.
CPC ............... G06F 11/26 (2013.01); G06F 1/10 (2013.01); G06F 13/24 (2013.01)

(58) Field of Classification Search
CPC combination set(s) only.
See application file for complete search history.

(56) References Cited

U.S. PATENT DOCUMENTS

| | | | | |
|---|---|---|---|---|
| 5,867,644 | A * | 2/1999 | Ranson | G06F 11/364 714/39 |
| 6,263,458 | B1 * | 7/2001 | Miller | G06F 11/3495 702/184 |
| 6,543,003 | B1 | 4/2003 | Floyd et al. | |
| 7,061,272 | B2 * | 6/2006 | Wilkes | G05B 19/045 326/37 |
| 7,343,476 | B2 * | 3/2008 | Floyd | G06F 9/3012 712/216 |
| 8,332,697 | B1 * | 12/2012 | Peattie | G01R 31/3177 714/724 |
| 8,572,527 | B1 * | 10/2013 | Coelho, Jr. | G06F 17/5022 716/102 |
| 9,268,627 | B2 | 2/2016 | Kraipak et al. | |
| 9,583,218 | B1 * | 2/2017 | Hutton | G11C 29/56008 |
| 2008/0148343 | A1 * | 6/2008 | Taniguchi | G06F 11/2236 726/1 |
| 2012/0206281 | A1 * | 8/2012 | Bashirullah | H03M 1/1061 341/110 |

(Continued)

*Primary Examiner* — Amine Riad
(74) *Attorney, Agent, or Firm* — Holland & Hart LLP

(57) ABSTRACT

Systems and methods for improving system debugging using finite state machines are described. In one embodiment, the systems and methods includes selecting, by a first multiplexor, a period of a timer tick for one or more blocks of a system on a chip (SoC), comparing, by a first comparator, a current state of the one or more blocks to a previous state of the one or more blocks, and receiving, by a finite state machine (FSM), the result from the first comparator as a first input, receiving a pulse based on the selected period of the timer tick from the first multiplexor as a second input, and based on the first and second inputs generating an output indicating whether the current and previous states remain unchanged after a time of at least two timer ticks. In one embodiment, a result from the first comparator indicates whether the current state equals the previous state of the one or more blocks.

20 Claims, 12 Drawing Sheets

(56) References Cited

U.S. PATENT DOCUMENTS

2014/0053036 A1\* 2/2014 Nixon .............. G01R 31/31705
 714/734
2015/0212154 A1\* 7/2015 Krishnani ........ G01R 31/31705
 714/745

\* cited by examiner

RAPID SYSTEM DEBUGGING USING FINITE STATE MACHINES

SUMMARY

The present disclosure is directed to methods and systems for improving system debugging using finite state machines. In some embodiments, the present systems and methods may reduce the time taken to debug a hang condition within the system. In some cases, the present systems and methods enable a hang condition to be diagnosed in real time.

A system for improving system debugging using finite state machines is described. In one embodiment, the system may include a first multiplexor to select a period of a timer tick for one or more sub-systems of the system, a first comparator to compare a current state of the one or more sub-systems to a previous state of the one or more sub-systems, and a finite state machine (FSM) to receive a result from the first comparator as a first input. In some cases, the FSM may receive a pulse based on the selected period of the timer tick from the first multiplexor as a second input and based on the first and second inputs generate an output indicating whether the current and previous states remain unchanged after a time of at least two timer ticks.

In some embodiments, the system may include a second comparator to compare the last state of the one or more sub-systems to a default state of the one or more sub-systems. In some cases, the result from the first comparator may indicate whether the current state equals the previous state of the one or more sub-systems. In some cases, the result from the second comparator may indicate whether the current state equals the default state of the one or more sub-systems.

In some embodiments, the system may include an OR gate to receive a result of the second comparator and a default state setting. In some cases, the default state setting indicates whether to trigger an interrupt for the default state. In some embodiments, the system may include a third comparator to compare the output from the FSM to a result of the OR gate. In some cases, the result from the OR gate indicates whether to trigger an interrupt when the current state remains in the default state for at least two periods of the timer tick.

In some embodiments, the system may include a processor of the system to receive a result from the third comparator and generate an interrupt when the result from the third comparator indicates a state of the one or more sub-systems remains unchanged for at least two periods of the timer tick. In some cases, the interrupt identifies a specific sub-system from the system.

In some embodiments, the system may include a second multiplexor to receive multiple state vectors and select a first state vector of a first sub-system from the system. In some cases, each of the multiple state vectors may be associated with a different sub-system from the one or more sub-systems. In some embodiments, the system may include a synchronizer to synchronize the multiple state vectors to a fastest clock of the one or more sub-systems.

In some embodiments, the system may include an AND gate to mask the first state vector with a first mask value and provide to the first comparator the masked first state vector as a current state of the first sub-system.

In some embodiments, the system may include a control register to select a second state vector from the system debug bus. In some embodiments, the system may include an AND gate to mask the second state vector with a second mask value and provide to the first comparator the masked second state vector as a current state of a second sub-system from the system.

In some embodiments, the system may include control logic to identify a state variable being written to at least one of data memory and a scratch register, the state variable being associated with a software based state machine. In some embodiments, the system may include an AND gate to mask the identified state variable with a third mask value and provide to the first comparator the masked state variable as a current state of the software based state machine.

An apparatus for improving system debugging using finite state machines is also described. In one embodiment, the apparatus may include a processor, memory in electronic communication with the processor, and instructions stored in the memory. The apparatus may include a first multiplexor to select a period of a timer tick for one or more blocks of a system on a chip (SoC), a first comparator to compare a current state of the one or more blocks to a previous state of the one or more blocks. In some cases, a result from the first comparator may indicate whether the current state equals the previous state of the one or more blocks. In some cases, the apparatus may include a finite state machine (FSM) to receive the result from the first comparator as a first input, receive a pulse based on the selected period of the timer tick from the first multiplexor as a second input, and based on the first and second inputs generate an output indicating whether the current and previous states remain unchanged after a time of at least two timer ticks.

A method for improving system debugging using finite state machines is also described. In one embodiment, the method may include selecting, by a first multiplexor, a period of a timer tick for one or more blocks of a system on a chip (SoC), comparing, by a first comparator, a current state of the one or more blocks to a previous state of the one or more blocks, and receiving, by a finite state machine (FSM), the result from the first comparator as a first input, receiving a pulse based on the selected period of the timer tick from the first multiplexor as a second input, and based on the first and second inputs generating an output indicating whether the current and previous states remain unchanged after a time of at least two timer ticks. In some cases, a result from the first comparator indicates whether the current state equals the previous state of the one or more blocks.

The foregoing has outlined rather broadly the features and technical advantages of examples according to this disclosure so that the following detailed description may be better understood. Additional features and advantages will be described below. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein—including their organization and method of operation—together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label.

Further, various components of the same type may be distinguished by following a first reference label with a dash and a second label that may distinguish among the similar components. However, features discussed for various components—including those having a dash and a second reference label—apply to other similar components. If only the first reference label is used in the specification, the description is applicable to any one of the similar components having the same first reference label irrespective of the second reference label.

DETAILED DESCRIPTION

Figure 1:
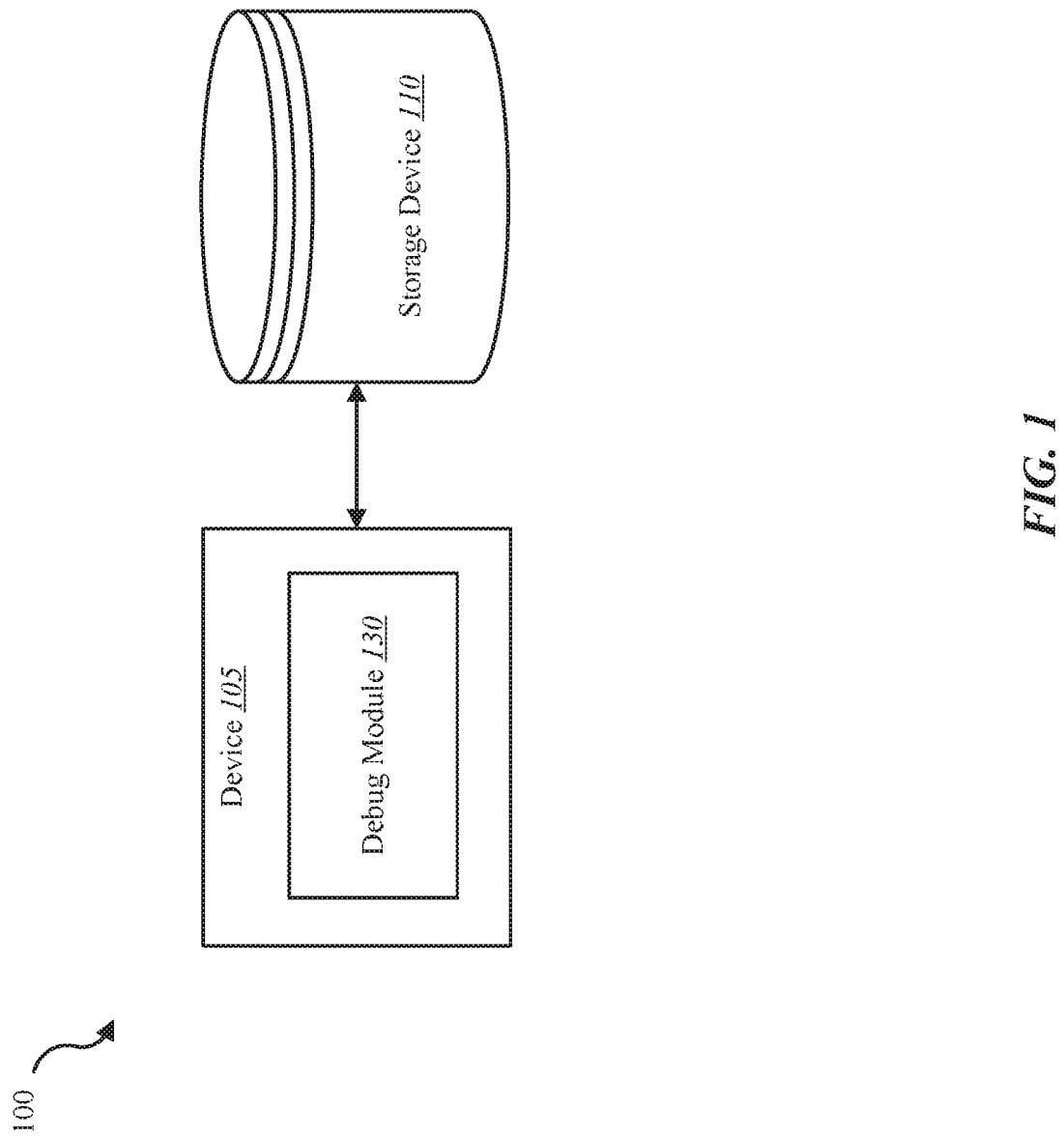
FIG. 1 is a block diagram of an example of a system in accordance with various embodiments.

The following relates generally to improving system debugging using finite state machines. A system on a chip or system on chip (SoC) may include an integrated circuit (IC) that integrates components of a computer or other electronic system into a single computer chip.

The SoC may include several reusable, reprogrammable blocks. These blocks may be referred to as intellectual property (IP) blocks or IP cores. These reusable components may include synthesizable register-transfer level (RTL) designs (soft cores) or layout level designs (hard cores). Accordingly, the SoC may contain blocks of digital, analog, mixed-signal, and radio-frequency functions all on a single chip substrate. In some embodiments, the SoC may include blocks of a microcontroller, microprocessor, digital signal processor (DSP) core, multiprocessors, memory blocks including any combination of read-only memory (ROM), random access memory (RAM), electrically erasable programmable ROM (EEPROM), and flash memory. The SoC may include timing sources including oscillators and phase-locked loops, peripherals including counter-timers, real-time timers and power-on reset generators, external interfaces, including industry standards such as USB®, FIREWIRE®, Ethernet, USART®, serial peripheral interface bus, etc. The SoC may include analog interfaces including analog to digital converters (ADCs) and digital to analog converters (DACs), voltage regulators and power management circuits, and so forth. One or more buses, either proprietary or industry-standard, may connect these blocks. One or more direct memory access (DMA) controllers on the SoC may route data directly between external interfaces and memory, bypassing the processor core and thereby increasing the data throughput of the SoC.

Debugging and analyzing hang conditions at system level may take relatively long debug cycles to estimate and confirm a particular block in a stuck state, leading to unpredictable system behavior. For example, a debug cycle may take weeks or even months to debug depending upon the complexity of the issue. In general, a processor of the system may use its dedicated watchdog timers to debug a hang condition. When a watchdog expires, the processor may reset the system. But watchdog timers are not able to detect hardware hang conditions other than errors related to the processor Execution Bus. In debug mode, when the watchdog timer expires, diagnostic firmware traverses backwards towards the source of the issue. Many times the issue is not resolved until states of the system are observed in either a status register or on a debug bus observed on a logic analyzer. In some cases, a bug may not be identifiable within the system, and may require external monitoring to deduce the source of the error.

The present systems and methods pinpoint a hung state nearly simultaneously with the occurrence of the hung state, resulting in significant savings in debug time and costs such as when debugging occurs over days, weeks, and months.

The present systems and methods identify the various hardware block hang conditions which are stuck in the same state for a predetermined time period. Using a global general purpose timer block and a hardware efficient timeout per hardware and/or software finite state machine (FSM) in the system, the present systems and methods generate an interrupt to detect and debug hardware issues in real time, reducing system level debug time and providing appropriate debug action. In some cases, a single global timer block may be implemented per SoC. Alternatively, a timer block may be implemented per subsystem on the SoC. In some cases, a timer block may be implemented for each power domain of an SoC. For example, a timer block may be implemented for the 5V power domain, another for the 3.3V power domain, another for the 2.5V power domain, another for the 1.8V power domain, and so forth. Generated timer ticks may be synchronized using a pulse synchronizer. In some cases, various timer ticks may be synchronized on a fastest clock to save hardware logic.

The present systems and methods add parallel observability to FSMs in design in a hardware efficient manner. Timer ticks (e.g., 1 µs, 0.5 ms, 1 ms, 10 ms, 100 ms, 1 s, 1 min, etc.) are programmable per FSM and generated in a global timing module to minimize the hardware impact.

When a timer waiting window expires, it generates a block level debug interrupt to the CPU. Multiple such block level interrupts can be funneled through a common system level debug interrupt to the CPU and/or on the chip level debug bus to be used as a trigger to capture critical and real time system debug data. The CPU can monitor the state of FSM in hang condition via a status register.

The present systems and methods provide immediate diagnosis of the hung state in conjunction with one or more registers such as a peripheral status register, a configuration status register (CSR), or any combination thereof. In some cases, the one or more registers may indicate hardware, firmware, and/or software configuration options for one or more embodiments of the present systems and methods. For example, the one or more registers may provide a reference clock setting, a state machine clock setting, a reference reset setting, a tick timer selection setting, a state machine selection setting, a mask value setting, an interrupt setting such as whether to generate an interrupt when a state is in the default setting, or any combination thereof. The interrupt generation may be tested by firmware using one dummy control bit via a control register to build system level debug code infrastructure/handlers. In some cases, the present systems and methods may use a setting of a register to configure whether to bypass generating an interrupt when the state machine is in a default state. Bypassing generating an interrupt for the default state may enable debug firmware to filter out false hardware and/or software hang conditions.

In some cases, the diagnostic features of the present systems and methods may be activated and deactivated to save power in normal chip operation. For example, the present systems and methods may be activated or enabled in a diagnostic mode, and deactivated or disabled in a default or normal operation mode.

FIG. 1 is a block diagram illustrating one embodiment of an environment 100 in which the present systems and methods may be implemented. The environment may include device 105 and storage device 110. The storage device 110 may include any combination of hard disk drives, solid state drives, and hybrid drives that include both hard disk and solid state drives. In some embodiments, the systems and methods described herein may be performed on a single device (e.g., device 105). In some cases, the methods described herein may be performed on multiple storage devices or a network of storage devices. Examples of device 105 include a storage server, a storage enclosure, a storage controller, storage drives in a distributed storage system, storage drives on a cloud storage system, storage devices on personal computing devices, storage devices on a server, or any combination thereof. In some configurations, device 105 may include a debug module 130. In one example, the device 105 may be coupled to storage device 110. In some embodiments, device 105 and storage device 110 may be components of flash memory or a solid state drive. Alternatively, device 105 may be a component of a host (e.g., operating system, host hardware system, etc.) of the storage device 110.

In one embodiment, device 105 may be a computing device with one or more processors, memory, and/or one or more storage devices. In some cases, device 105 may include a wireless storage device. In some embodiments, device 105 may include a cloud drive for a home or office setting. In one embodiment, device 105 may include a network device such as a switch, router, access point, or any combination thereof. In one example, device 105 may be operable to receive data streams, store and/or process data, and/or transmit data from, to, or in conjunction with one or more local and/or remote computing devices.

The device 105 may include a database. In some cases, the database may be internal to device 105. In some embodiments, storage device 110 may include a database. Additionally, or alternatively, the database may include a connection to a wired and/or a wireless database. Additionally, as described in further detail herein, software and/or firmware (e.g., stored in memory) may be executed on a processor of device 105. Such software and/or firmware executed on the processor may be operable to cause the device 105 to monitor, process, summarize, present, and/or send a signal associated with the operations described herein.

In some embodiments, storage device 110 may connect to device 105 via one or more networks. Examples of networks include cloud networks, local area networks (LAN), wide area networks (WAN), virtual private networks (VPN), a personal area network, near-field communication (NFC), a telecommunications network, wireless networks (using 802.11, for example), and/or cellular networks (using 3G and/or LTE, for example), etc. In some configurations, the network may include the Internet and/or an intranet. The device 105 may receive and/or send signals over a network via a wireless communication link. In some embodiments, a user may access the functions of device 105 via a local computing device, remote computing device, and/or network device. For example, in some embodiments, device 105 may include an application that interfaces with a user. In some cases, device 105 may include an application that interfaces with one or more functions of a network device, remote computing device, and/or local computing device.

In one embodiment, the storage device 110 may be internal to device 105. As one example, device 105 may include a storage controller that interfaces with storage media of storage device 110. Debug module 130 may detect hang conditions associated with device 105 and/or storage device 110 in real time.

Figure 2:
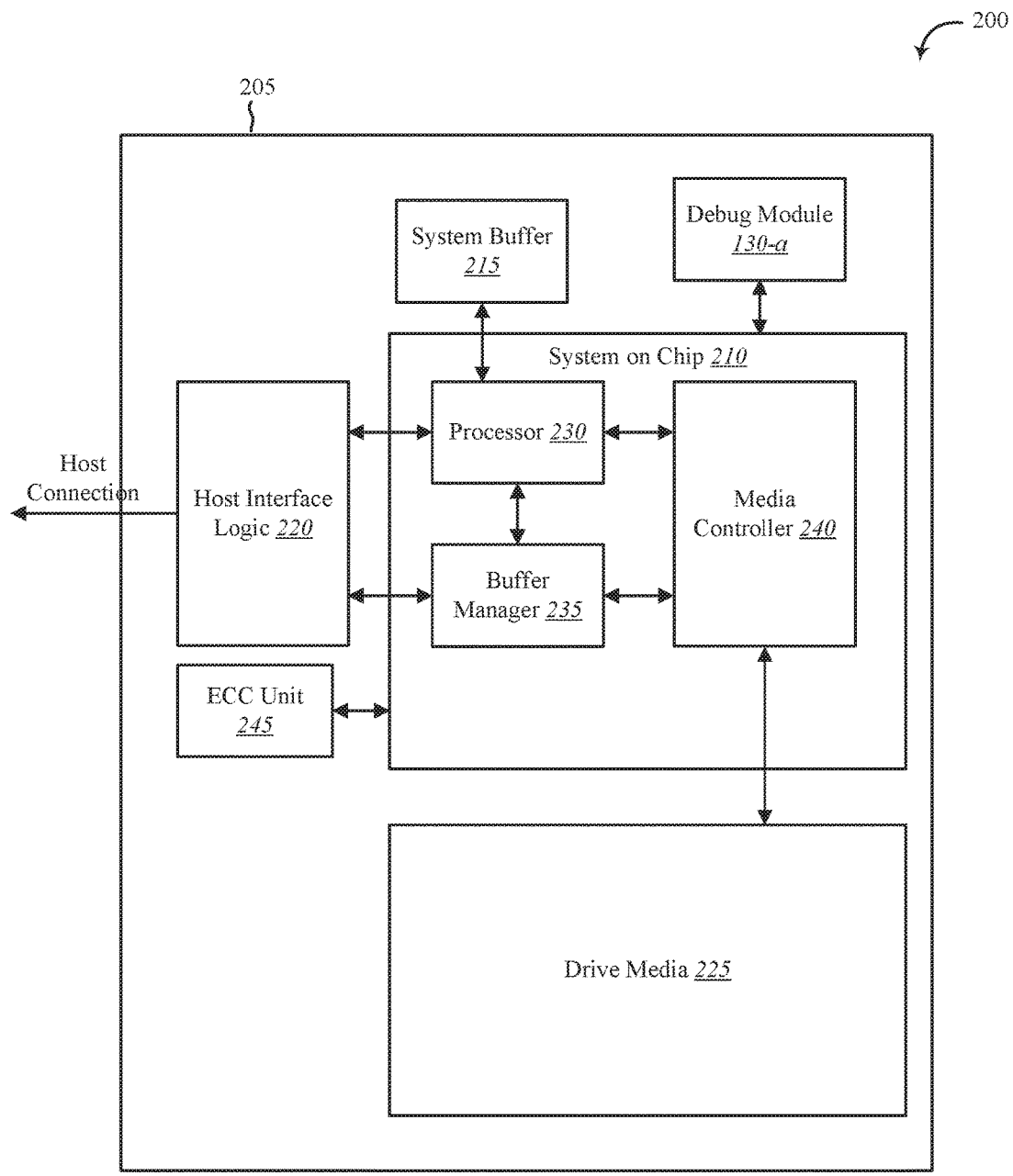
FIG. 2 shows a block diagram of a device in accordance with various aspects of this disclosure.

FIG. 2 shows a block diagram 200 of an apparatus 205 for use in electronic communication, in accordance with various aspects of this disclosure. The apparatus 205 may be an example of one or more aspects of device 105 described with reference to FIG. 1. The apparatus 205 may include a system on chip (SoC) 210, system buffer 215, host interface logic 220, drive media 225, and debug module 130-a. Each of these components may be in communication with each other and/or other components directly and/or indirectly.

One or more of the components of the apparatus 205, individually or collectively, may be implemented using one or more application-specific integrated circuits (ASICs) adapted to perform some or all of the applicable functions in hardware. Alternatively, the functions may be performed by one or more other processing units (or cores), or on one or more integrated circuits and/or SoCs such as SoC 210. In other examples, other types of integrated circuits may be used (e.g., Structured/Platform ASICs, Field Programmable Gate Arrays (FPGAs), and other Semi-Custom ICs), which may be programmed in any manner known in the art. The functions of each module may also be implemented—in whole or in part—with instructions embodied in memory formatted to be executed by one or more general and/or application-specific processors.

In one embodiment, the SoC 210 may include a processor 230, a buffer manager 235, and a media controller 240. The SoC 210 may process, via processor 230, read and write requests in conjunction with the host interface logic 220, the interface between the apparatus 205 and the host of apparatus 205 (e.g., an operating system, host hardware system, etc.). The system buffer 215 may hold data temporarily for internal operations of apparatus 205. For example, a host may send data to apparatus 205 with a request to store the data on the drive media 225. The driver controller or SoC 210 may process the request and store the received data in the drive media 225. In some cases, a portion of data stored in the drive media 225 may be copied to the system buffer 215 and the processor 230 may process or modify this copy of data and/or perform an operation in relation to this copy of data held temporarily in the system buffer 215.

Although depicted outside of SoC 210, in some embodiments, debug module 130-a may include software, firmware, and/or hardware located within SoC 210. For example, debug module 130-a may include at least a portion of processor 230, buffer manager 235, and/or media controller 240. In one example, debug module 130-a may include one or more instructions executed by processor 230, buffer manager 235, and/or media controller 240. The debug module 130-*a* may be configured to debug a finite state machine associated with apparatus 205 when a state of the finite state machine remains in a certain state for a predetermined period of time.

Figure 3:
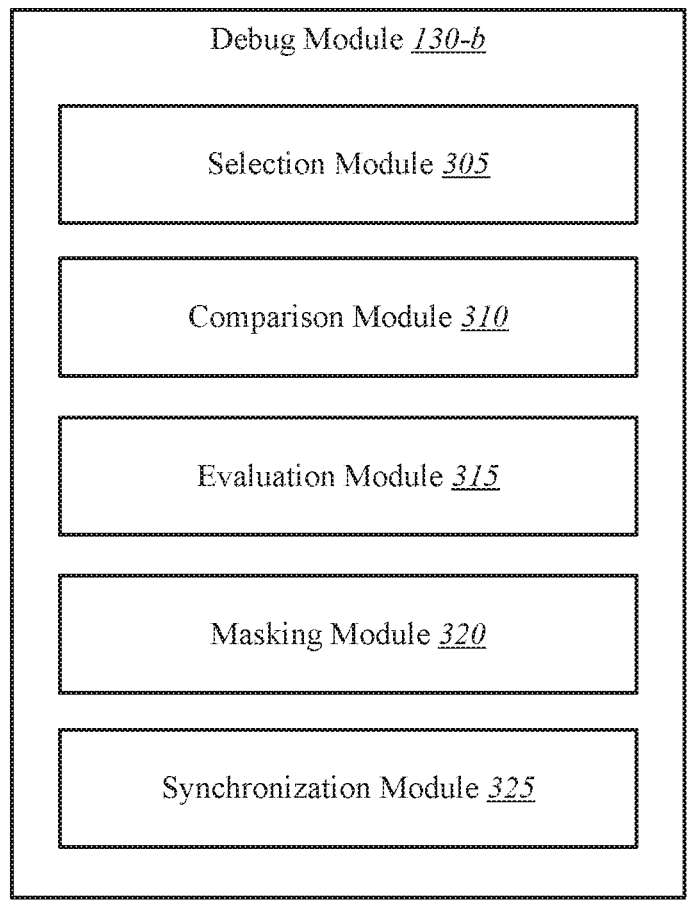
FIG. 3 shows a block diagram of one or more modules in accordance with various aspects of this disclosure.

FIG. 3 shows a block diagram of a debug module 130-*b*. The debug module 130-*b* may include one or more processors, memory, and/or one or more storage devices. The debug module 130-*b* may include selection module 305, comparison module 310, evaluation module 315, masking module 320, and synchronization module 325. The debug module 130-*b* may be one example of debug module 130 of FIGS. 1 and/or 2. Each of these components may be in communication with each other. In some embodiments, the debug module 130 may perform certain operations of the present systems and methods in conjunction with any combination of systems on chip, processors, ASICs, memory, multiplexors, comparators, finite state machines, logical gates, synchronizers, control registers, control logic, or any combination thereof.

In one embodiment, selection module 305 may be configured to select a period of a timer tick for one or more sub-systems of a system. As one example, selection module 305 may select a period of 1 microsecond, 1 millisecond, 1 second, or 1 minute for the timer tick. The system may include a system on chip (SoC), a storage system, a computing system, and/or other types of systems. In some cases, the one or more sub-systems may refer to blocks of an SoC. For example, the one or more sub-systems may refer to an intellectual property (IP) block or IP core of an SoC.

In some embodiments, comparison module 310 may be configured to perform a first comparison comparing a current state of a sub-system to a previous state of the sub-system. In some embodiments, at least one of the sub-systems may be associated with a hardware-based state machine. In some cases, the result of the first comparison may indicate whether the current state equals the previous state of the sub-system, indicating that a hang condition may be present in the system.

In one embodiment, evaluation module 315 may be configured to receive the result of the first comparison from comparison module 310 as a first input and to receive a pulse based on the selected period of the timer tick selected by the selection module 305 as a second input. In some embodiments, evaluation module 315 may be configured to generate, based on an evaluation of the first and second inputs, a first output indicating whether the current and previous states remain unchanged after a time of at least two timer ticks. A state of a sub-system remaining unchanged for a period of at least two timer ticks may indicate the sub-system is in a hang condition.

In some embodiments, comparison module 310 may be configured to perform a second comparison comparing the last state of the sub-system to a default state of the sub-system. In some embodiments, the result of the second comparison may indicate whether the current state equals the default state of the sub-system. In some embodiments, evaluation module 315 may be configured to generate a second output based on the evaluation module 315 receiving and evaluating the result of the second comparison and a default state setting. In some cases, the default state setting may indicate whether to trigger an interrupt for the default state.

In some embodiments, a sub-system may remain in a default state for two or more periods of the selected timer tick without being in a hang condition. For example, with a timer tick selection of one second, a sub-system may remain in a default state for two or more seconds without being in a hang condition. Thus, in some cases, an interrupt may not be generated when the sub-system is indicated as being in the default state for a period of at least two timer ticks.

In some embodiments, comparison module 310 may be configured to perform a third comparison comparing the first output from the evaluation module 315 to the second output from the evaluation module 315. In some cases, the second output from the evaluation module 315 may indicate whether to trigger an interrupt when the current state remains in the default state for at least two periods of the timer tick. In some embodiments, evaluation module 315 may be configured to receive the result of the third comparison and generate an interrupt when the result from the third comparison indicates a state of the sub-system remains unchanged for at least two periods of the timer tick. In some cases, the interrupt may indicate a specific sub-system from the system. Thus, as one example, with a selected timer tick of one microsecond, the evaluation module 315 may generate an interrupt when a sub-system remains in the same state, other than a default state, after at least two microseconds have elapsed.

In some embodiments, selection module 305 may be configured to receive multiple state vectors and select a first state vector of a first sub-system from the system. In some cases, each of the multiple state vectors may be associated with a different sub-system from the one or more sub-systems. For example, a first state vector may be associated with a first sub-system from the one or more sub-systems, a second state vector may be associated with a second sub-system from the one or more sub-systems, and so forth. Thus, selection module 305 may receive state vectors from the first and second sub-systems as well as state vectors from other sub-systems and select one of the several received state vectors to test. Thus, out of the multiple state vectors, only one sub-system may be tested at a time.

In one embodiment, synchronization module 325 may be configured to synchronize the multiple state vectors to a fastest clock of the one or more sub-systems. In some cases, the synchronization module 325 may synchronize the state vector selected by selection module 305. In some embodiments, the fastest clock may be the fastest clock available to the selected sub-system, the fastest clock available to the sub-systems of the multiple state vectors, or the fastest clock available to the overall system.

In some embodiments, masking module 320 may be configured to mask the state vector selected by the selection module 305 with a first mask value and provide to the comparison module 310 the masked selected state vector as a current state of the first sub-system.

In one embodiment, selection module 305 may be configured to select a state vector from a system debug bus. In some embodiments, masking module 320 may be configured to mask this selected state vector with a mask value and provide to the comparison module 310 the masked selected state vector as a current state of the sub-system associated with the selected state vector.

In some embodiments, evaluation module 315 may be configured to identify a state variable being written to data memory of the system. For example, evaluation module 315 may include logic that detects data being written to the data memory. In some cases, the identified state variable may be associated with a software based state machine. In some embodiments, masking module 320 may be configured to mask the identified state variable with a mask value and provide to the comparison module 310 the masked state variable as a current state of the software based state machine.

In some embodiments, evaluation module 315 may be configured to identify a state variable being written to a scratch register. In some cases, the state variable may be associated with a software based state machine. In some embodiments, masking module 320 may be configured to mask the identified state variable with a mask value and provide to the comparison module 310 the masked state variable as a current state of the software based state machine.

Figure 4:
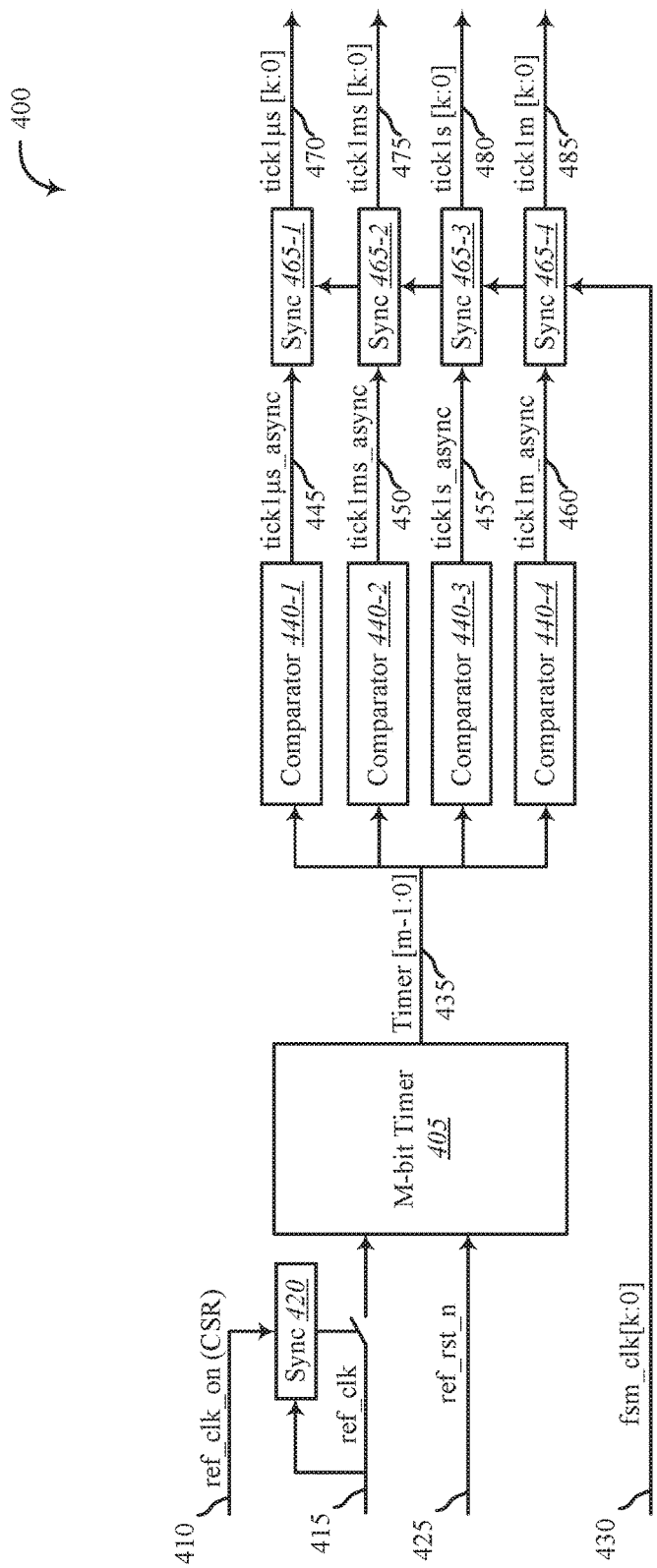
FIG. 4 shows one embodiment of an environment in accordance with various aspects of this disclosure.

FIG. 4 shows an environment 400 for improving system debugging using finite state machines, in accordance with various examples. Environment 400 depicts a timer block of a system. As explained above, a block may be a subsystem of a system on chip (SoC). Thus, in some embodiment, environment 400 may be one part of a system such as a SoC. At least one aspect of environment 400 may be implemented in conjunction with device 105 of FIG. 1, apparatus 205 of FIG. 2, and/or debug module 130 depicted in FIGS. 1, 2, and/or 3.

As depicted, environment 400 may include a timer 405, multiple comparators 440, and multiple synchronizers 420 and 465. As shown, the timer 405 may be configured as a bit timer with M bits. The multiple synchronizers 420 and 465 may include level and/or pulse synchronizers. As depicted, synchronizer 420 may enable timer 405 to receive ref_clk 415 based on signal ref_clk on 410. Timer 405 may output signal timer 435, which may be received by comparators 440. Comparators 440 may output timer ticks 445, 450, 455, and 460. Timer ticks 445, 450, 455, and 460 may be received by synchronizers 465. Synchronizers may synchronize timer ticks 445, 450, 455, and 460 based on signal fsm_clk 430. Synchronizers 465 may then output synchronized timer ticks 470, 475, 480, and 485.

In some embodiments, environment 400 may be configured as a global or central timer block for a system such as an SoC. In one embodiment, timer 405 may receive a reference clock signal ref_clk 415 in relation to synchronizer 420. Synchronizer may enable timer 405 to receive ref_clk 415 based on a signal ref_clk on 410. The signal ref_clk on 410 may be configured via a register such as a configuration status register (CSR).

As shown, timer 405 generates signal timer [m−1:0] 435, which is fed into several comparators 440. As shown, a first comparator 440-1 generate a microsecond-based timer tick signal tick1 μs_async, a second comparator 440-2 generate a millisecond-based timer tick signal tick1ms_async, a third comparator 440-3 generate a one second-based timer tick signal tick1s_async, and a fourth comparator 440-4 generate a minute-based timer tick signal tick1m_async. Each timer tick signal is then fed into a relative synchronizer 465 controlled by a FSM clock signal fsm_clk[k:0] 430. As shown, the FSMs working on "k+1" different clocks get the timer ticks. Accordingly, each timer tick signal is synchronized centrally in an FSM clock domain. In some cases, each timer tick signal may be synchronized to a fastest clock domain. In some embodiments, one or more FSMs may run on different clock frequencies. Accordingly, the different ticks generated by such FSMs may be synchronized using synchronizers 465. As shown, the various FSM clocks may be synchronized centrally. Alternatively, each FSM clock may be synchronized local to each respective FSM.

In one embodiment, the comparators 440 compare whether a relative count is reached or not. The comparators 440 may be implemented in a hardware efficient manner via parameters defined per SoC implementation based on the frequency of reference clock signal ref_clk 415. In one embodiment, a unique instance of the timer block of environment 400 may be implemented per SoC. Alternatively, the timer block may decide to have one instance of this timer block per subsystem and/or power domains.

In some embodiments, the timer ticks can vary as per implementation or system requirements. A default state may be programmable via firmware in relation to a register or can be hard-coded using parameters in the register-transfer level (RTL). In some embodiments, a general purpose timer block as shown in FIG. 4 may be reused by other blocks in an SoC to maintain some periodic timers/action. In some embodiments, the interrupts generated due to hang conditions may be used to reset an IP block or the logical sub-partition or partition containing the IP block or the entire power domain or the chip depending on the system design requirements.

Figure 5:
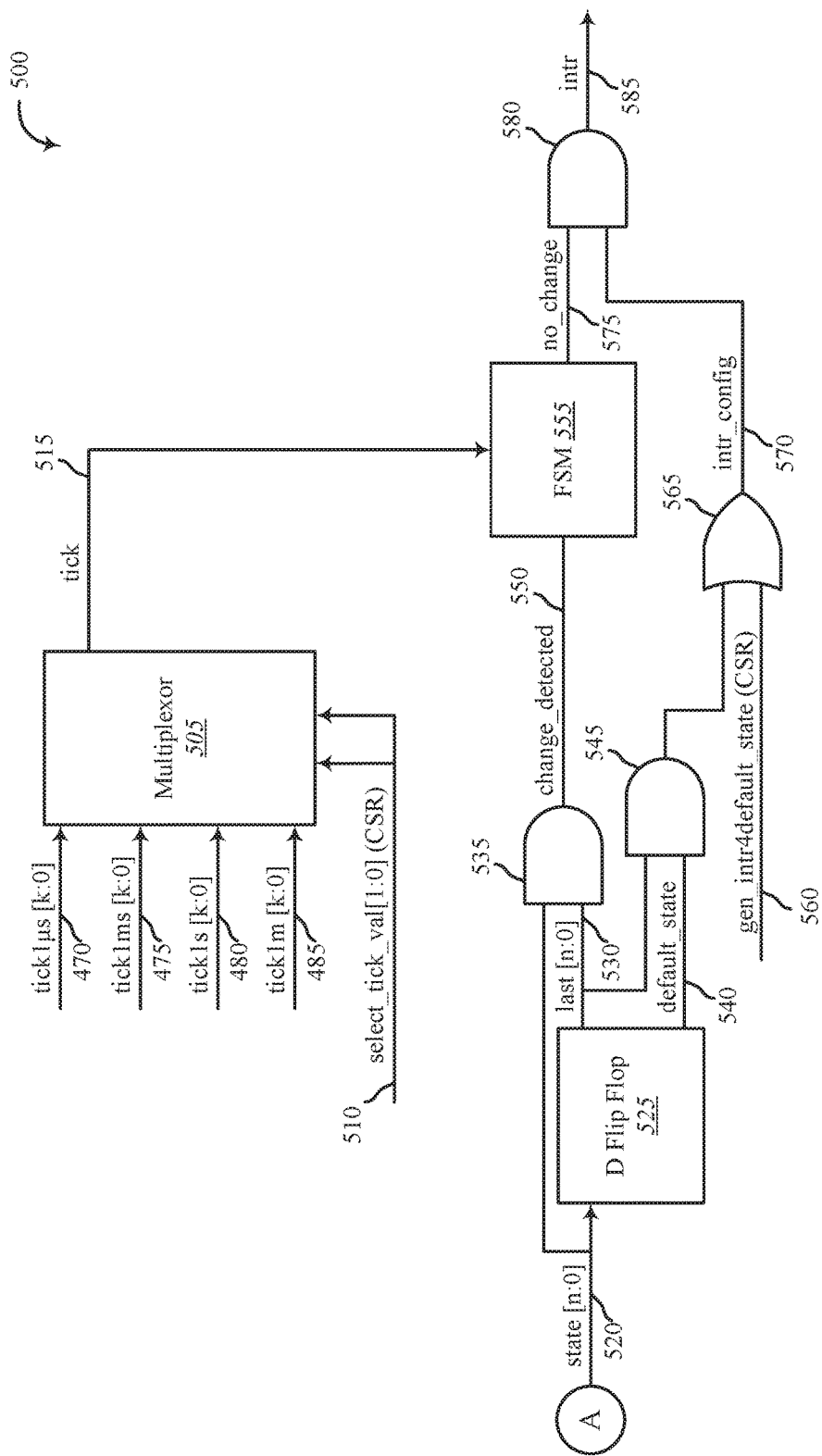
FIG. 5 shows one embodiment of an environment in accordance with various aspects of this disclosure.

FIG. 5 shows an environment 500 for improving system debugging using finite state machines, in accordance with various examples. Environment 500 may be one part of a system such as a system on chip (SoC). At least one aspect of environment 500 may be implemented in conjunction with device 105 of FIG. 1, apparatus 205 of FIG. 2, and/or debug module 130 depicted in FIGS. 1, 2, and/or 3.

As depicted, environment 500 may include multiplexor 505, D flip flop 525, comparators 535 and 545, AND gate 580, FSM 555, and OR gate 565. In some embodiments, environment 500 depicts a single module or block containing logic configured to select ticks per FSM, decide to generate or not to generate an interrupt for a default state, and to generate an interrupt when an FSM remains in the same state between two time ticks. Thus, environment 500 may depict a hang detection logic block for a single FSM.

The default state may be programmable via firmware and/or hard-coded using parameters in the RTL. In one embodiment, the depicted environment 500 may be instantiated for each FSM. In some cases, environment 500 may be instantiated for each FSM within a block or for each critical FSM within a block. Instantiating environment 500 for each FSM provides the advantage of detecting a hang condition in multiple FSMs simultaneously.

To aid firmware debugging of this block without firmware having to generate hardware stuck conditions, a state signal 520 may be used as an input as shown. State signal 520 may be provided from the illustrated point A. In some cases, the state signal 520 may be a single bit signal selected by a register, such as a firmware CSR. Likewise, a tick signal 515 may be selected based on select_tick_val[1:0] signal 510 provided by a CSR.

As illustrated, multiplexor 505 receives timer tick signals 470, 475, 480 and 485 from the timer block environment 400 of FIG. 4. In one embodiment, multiplexor 505 selects a period of a timer tick for one or more sub-systems of the system in conjunction with select_tick_val signal 510. As a result, multiplexor 505 provides tick signal 515 to FSM 555. Thus, multiplexor 505, in one embodiment, represents a timer of environment 500 the provides a timer tick at a selected frequency. In some embodiments, the selected frequency of the timer tick may be based on the timer tick signals received from the timer block environment 400 of FIG. 4.

+In one embodiment, comparator 535 compares a current state of the one or more sub-systems (e.g., current state signal 520) to a previous state of the one or more sub-systems (e.g., last state 530). The result from comparator 535, signal change_detected 550, indicates whether the current state equals the previous state of the one or more sub-systems. FSM 555 receives a result from comparator 535 as a first input and receives tick signal 515 based on the selected period of the timer tick from the multiplexor 505 as a second input, and based on the first and second inputs FSM 555 generates an output indicating whether the current and previous states remain unchanged after a time of at least two timer ticks.

In some embodiments, comparator 545 compares the last state of the one or more sub-systems (last state 530) to a default state of the one or more sub-systems (default state 540). The result from comparator 535 indicates whether the current state signal 520 equals the default state 530 of the one or more sub-systems. As illustrated, OR gate 565 receives a result of comparator 545 and gen_intr4default state signal 560. In some embodiments, the signal gen_intr4default state signal 560 indicates whether an interrupt is to be generated when the state machine being monitored remains in the default state. Accordingly, the result from OR gate 565 indicates whether to trigger an interrupt when the current state remains in the default state for at least two periods of the timer tick.

As illustrated, AND gate 580 receives a result from FSM 555 (no_change signal 575) and an interrupt configuration signal (inter_config 570) from OR gate 565. AND gate 580 logically ANDs the output from the FSM and the result of the OR gate 565 to generate an interrupt (intr signal 585) based on the values of the inputs. For example, when no_change signal 575 indicates a state remains unchanged (e.g., no_change signal 575=logical true) and intr_config 570 indicates the current state is not the default state, then AND gate 580 may generate an interrupt (e.g., intr signal 585=logical true). In some cases, a processor of the system may receive intr signal 585 and generate a system interrupt when the result from AND gate 580 indicates a state of a sub-system remains unchanged for at least two periods of the timer tick.

Figure 6:
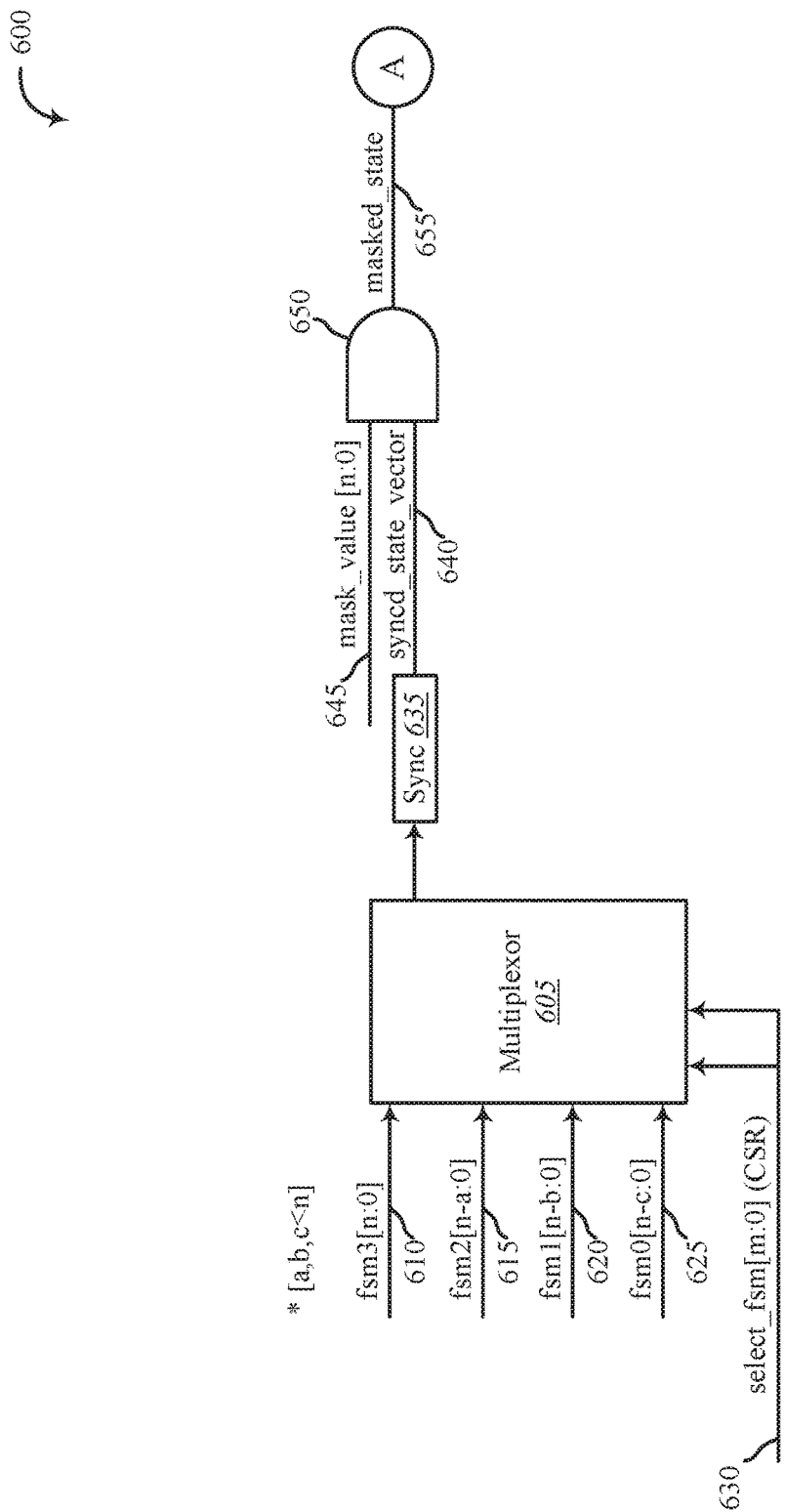
FIG. 6 shows another embodiment of an environment in accordance with various aspects of this disclosure.

FIG. 6 shows an environment 600 for improving system debugging using finite state machines, in accordance with various examples. Environment 600 may be one part of a system such as a system on chip (SoC). At least one aspect of environment 600 may be implemented in conjunction with device 105 of FIG. 1, apparatus 205 of FIG. 2, and/or debug module 130 depicted in FIGS. 1, 2, and/or 3.

As depicted, environment 600 may include multiplexor 605, synchronizer 635, and AND gate 650. As shown, multiplexor 605 may receive state vectors from multiple FSMs. For example, multiplexor may receive state vector fsm3[n:0] 610 from FSM 3, state vector fsm2[n-a:0] 615 from FSM 2, state vector fsm1[n-b:0] 620 from FSM 1, and state vector fsm0[n-c:0] 625 from FSM 0, and so on.

In some implementations, a number of FSMs may be grouped and control logic as depicted in FIGS. 5 and 6 may be used to detect hang conditions for the group of FSMs. In some embodiments, environment 600 is configured to operate on a fastest clock of the grouped FSMs. As shown, the FSM state vectors may be multiplexed and synchronized to the fastest clock domain. Grouping the FSMs may save on system resources. For example, a single system (e.g., environment 500) may be used to monitor two or more grouped FSMs instead of having a separate system for each FSM. However, when grouping FSMs, the hang condition of only a single FSM in the group may be detected at a time. For some state vector state variables, extra bits may be masked as shown in FIG. 6.

As explained above, in one embodiment, multiplexor 605 receives multiple state vectors 610, 615, 620, and 625. Multiplexor 605 may select a first state vector from the multiple state vectors received based on select fsm signal 630. As shown, synchronizer 635 may synchronize the selected state vector to a fastest clock of the one or more FSMs.

In one embodiment, AND gate 650 may mask the synchronized state vector (e.g., syncd_state_vector 640) with a mask value 645. Accordingly, AND gate 650 may output a masked state vector (e.g., masked_state 655) as a current state of the selected FSM. The outputted masked state vector may be provided at point A as illustrated. Accordingly, the masked state vector may be presented as a current state at point A of FIG. 5.

Figure 7:
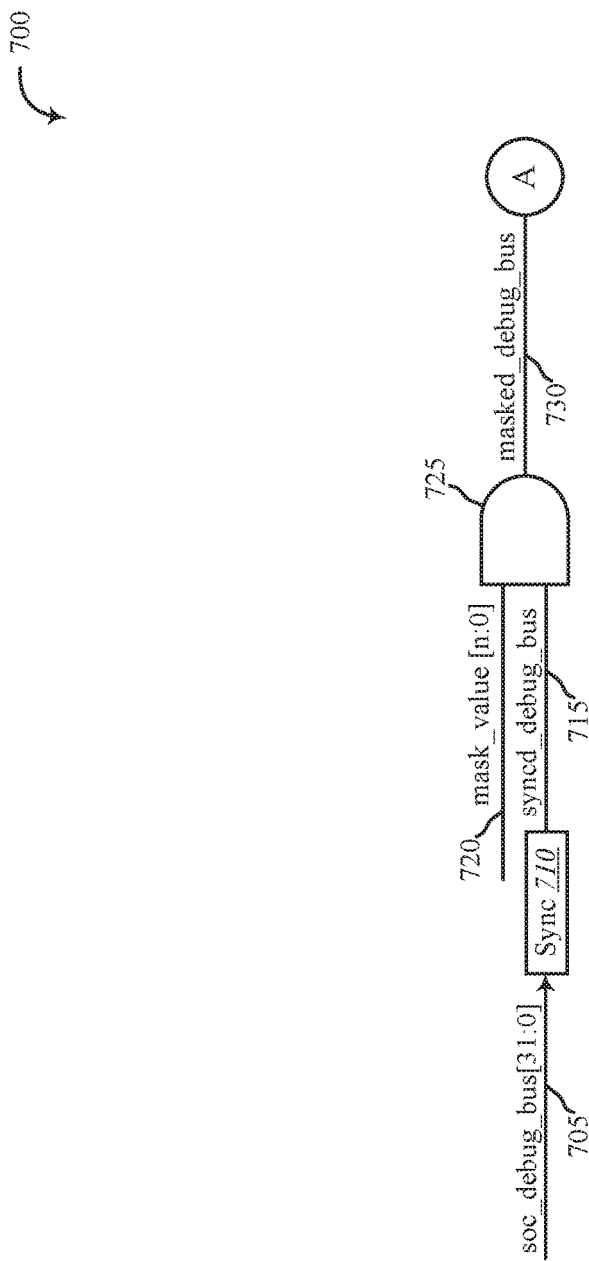
FIG. 7 shows another embodiment of an environment in accordance with various aspects of this disclosure.

FIG. 7 shows an environment 700 for improving system debugging using finite state machines, in accordance with various examples. Environment 700 may be one part of a system such as a system on chip (SoC). At least one aspect of environment 700 may be implemented in conjunction with device 105 of FIG. 1, apparatus 205 of FIG. 2, and/or debug module 130 depicted in FIGS. 1, 2, and/or 3. In some embodiments, environment 700 may be used to support legacy designs.

As depicted, environment 700 may include synchronizer 710 and AND gate 725. In one embodiment, a control register (e.g., CSR) may be configured to select a state vector from a system debug bus (e.g., debug bus 705). In some embodiments, a debug bus 705 of the system may be connected to state signal 520 of FIG. 5 to detect an FSM hang condition. Firmware may be configured to program a debug bus selection control register to select an FSM state vector from the debug bus 705. Synchronizer 710 may receive debug bus 705 and provide a synchronized debug bus 715 to AND gate 725. AND gate 725 may receive a mask value 720 and output a masked debug bus 730. Accordingly, AND gate 725 may then mask the selected state vector with a second mask value and provide to AND gate 725 the masked second state vector as a current state of a selected FSM. The debug bus 705 may be synchronized to a fastest clock domain via synchronizer 710. As shown, the outputted masked state vector from the debug bus may be provided at point A. Accordingly, the masked state vector may be presented as a current state at point A of FIG. 5.

Figure 8:
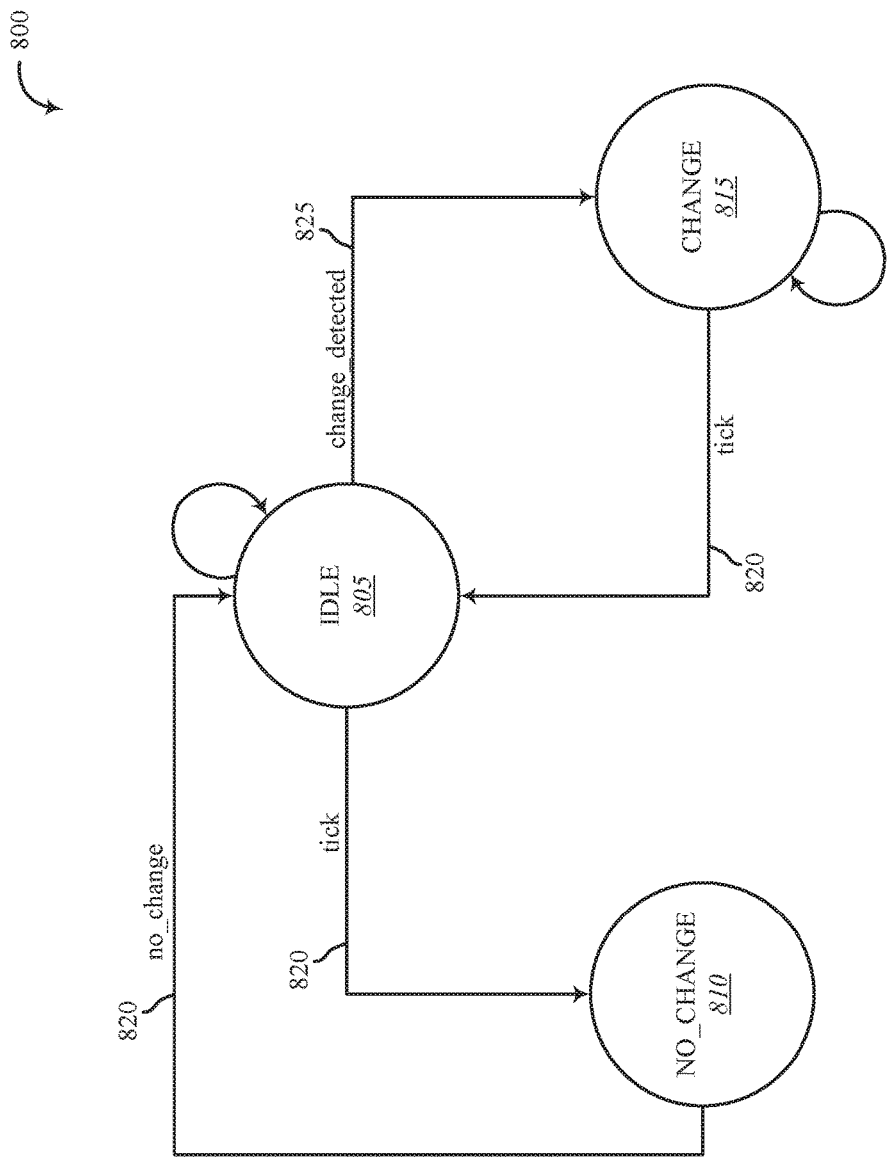
FIG. 8 shows another embodiment of an environment in accordance with various aspects of this disclosure.

FIG. 8 shows an environment 800 for improving system debugging using finite state machines, in accordance with various examples. Environment 800 may be one part of a system such as a system on chip (SoC). At least one aspect of environment 800 may be implemented in conjunction with device 105 of FIG. 1, apparatus 205 of FIG. 2, and/or debug module 130 depicted in FIGS. 1, 2, and/or 3.

As depicted, environment 800 depicts one embodiment of an FSM. The FSM of environment 800 may be configured to detect the change between previous and present states between two timer ticks of a timer such as two periods of a selected timer tick generated by multiplexor 505 of FIG. 5. As depicted, the FSM of environment 800 remains in an idle state 805 until either change_detected signal 825 or tick 820 becomes active. The hang condition is true when the depicted state machine enters the no_change state 810 when the timer expires. Otherwise, the hang condition is false when the depicted state machine enters the change state 815 when the timer expires.

Figure 9:
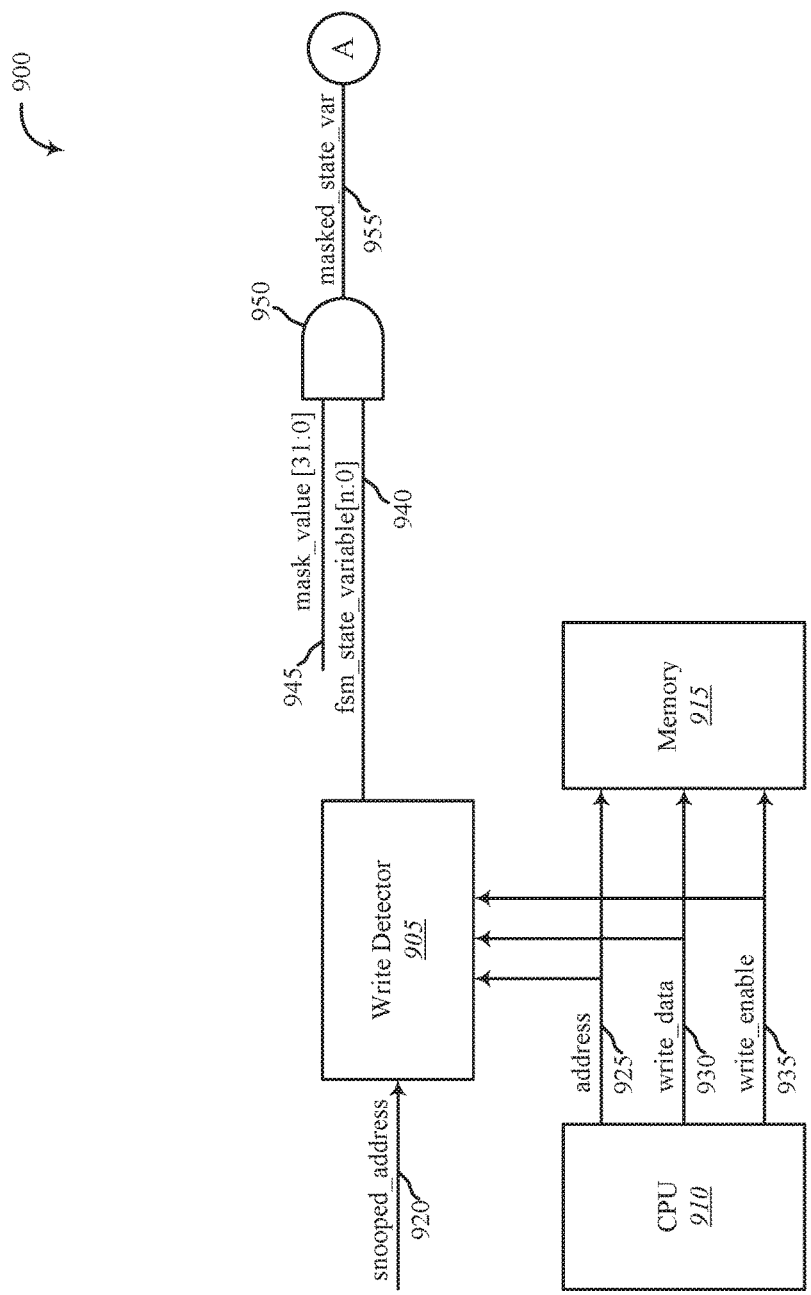
FIG. 9 shows another embodiment of an environment in accordance with various aspects of this disclosure.

FIG. 9 shows an environment 900 for improving system debugging using finite state machines, in accordance with various examples. Environment 900 may be one part of a system such as a system on chip (SoC). At least one aspect of environment 900 may be implemented in conjunction with device 105 of FIG. 1, apparatus 205 of FIG. 2, and/or debug module 130 depicted in FIGS. 1, 2, and/or 3.

As depicted, environment 900 may include write detector 905, CPU 910, memory 915, and AND gate 950. Environment 900 may depict a system to detect hang conditions in a software state machine. In one embodiment, a software state machine variable may be declared as a static volatile variable. The software state machine may be mapped to a known location in memory 915. The output of environment 900 may be connected to state[n:0] 520 of FIG. 5. The components of environment 900 may be used to detect a hang condition in software state machines.

In one embodiment, a software state machine variable may be stored in memory 915. For example, CPU 910 may write write_data 930 to memory 915. As depicted, CPU 910 may provide address 925 to address the location where write_data 930 is stored in memory 915 as well as provide a write_enable 935 to enable the write operation.

In one embodiment, an address may be snooped (e.g., snooped_address 920) by write detector 905. Accordingly, write detector 905 may detect a write operation in relation to an address bus, write strobe and relevant controls. In some cases, write detector 905 may include control logic to identify a state variable being written to memory 915. Write detector 905 may detect the write operation occurring on a particular address where the software state machine variable is stored. As depicted, write detector 905 may send the software state machine variable (e.g., fsm_state_variable 940) to AND gate 950. In some cases, AND gate 950 may mask the software state machine variable with mask_value 945. The outputted masked software state variable (e.g., masked_state_var 955) may be provided at point A as illustrated. Accordingly, the masked software state variable may be presented as a current state at point A of FIG. 5.

Figure 10:
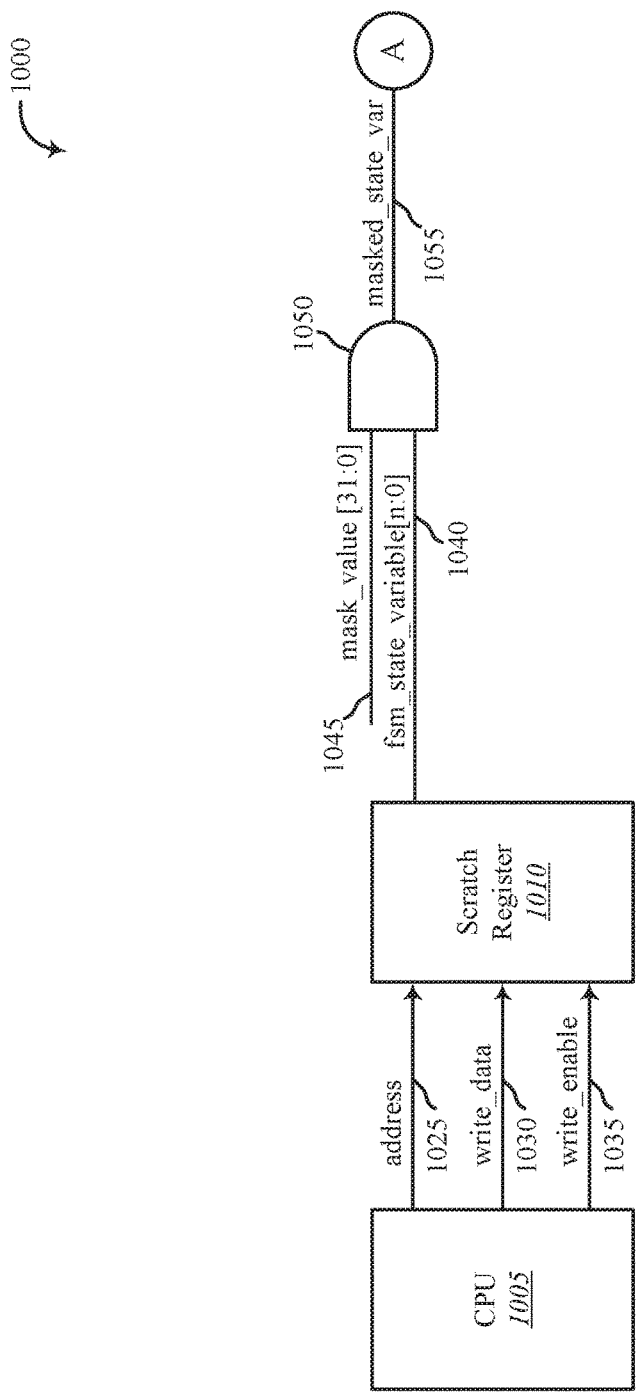
FIG. 10 shows another embodiment of an environment in accordance with various aspects of this disclosure.

FIG. 10 shows an environment 1000 for improving system debugging using finite state machines, in accordance with various examples. Environment 1000 may be one part of a system such as a system on chip (SoC). At least one aspect of environment 1000 may be implemented in conjunction with device 105 of FIG. 1, apparatus 205 of FIG. 2, and/or debug module 130 depicted in FIGS. 1, 2, and/or 3.

As depicted, environment 1000 may include CPU 1005, scratch register 1010, and AND gate 1050. Environment 1000 may depict a system to detect hang conditions in a software state machine. In one embodiment, a software state machine variable of environment 1000 may be declared as a static volatile variable. The software state machine may be mapped to a general purpose scratch register in any peripheral (e.g., scratch register 1010). The output of the scratch register 1010 may to be connected, via AND gate 1050, to state[n:0] 520 of FIG. 5. The illustrated component of environment 1000 may be used to detect the hang condition in software state machines.

In some embodiments, a software state machine variable may be captured by a general purpose scratch register such as scratch register 1010. As depicted, CPU 1005 may provide address 1025, write_date 1030, and write_enable 1035 to scratch register 1010. Based on the write data provided, scratch register 1010 may output a software state machine variable (e.g., fsm_state_variable 1040).

In one embodiment, AND gate 1050 may receive an output from scratch register 1010 (fsm_state_variable 1040) and a mask value (mask_value 1045). In some embodiments, AND gate may mask fsm_state_variable 1040 with mask_value 1045. Accordingly, AND gate 1050 may provide a masked software state variable (masked_state_var 1055) as a current state of a software based state machine. The outputted masked software state vector may be provided at point A as illustrated. Accordingly, the masked software state vector may be presented as a current state at point A of FIG. 5.

Figure 11:
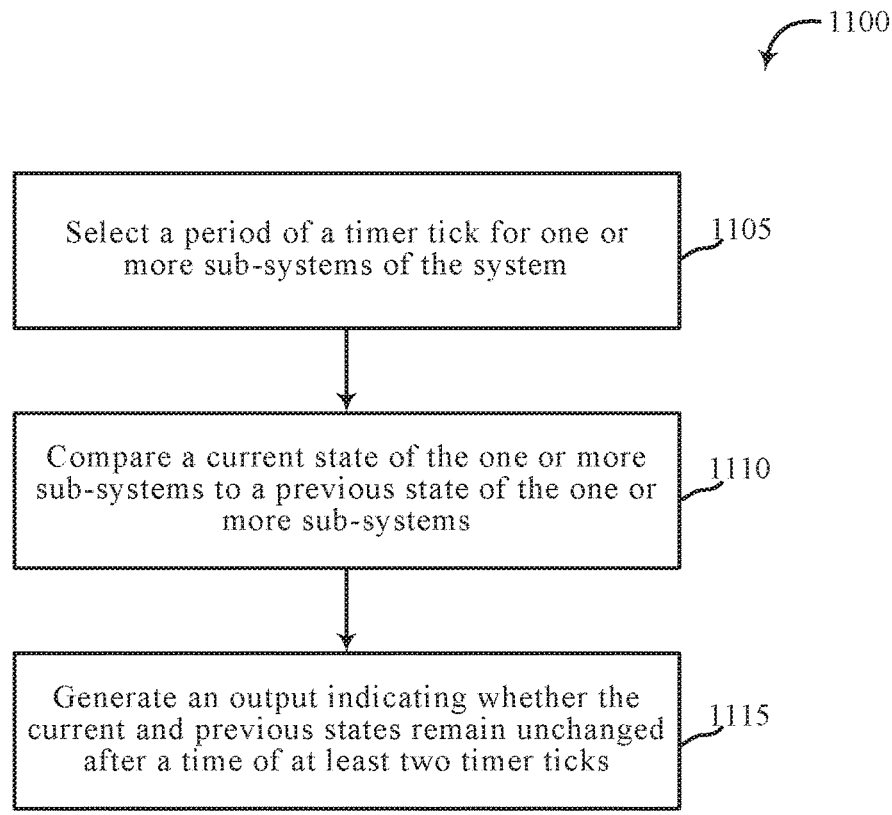
FIG. 11 is a flow chart illustrating an example of a method in accordance with various aspects of this disclosure.

FIG. 11 is a flow chart illustrating an example of a method 1100 for improving system debugging using finite state machines, in accordance with various aspects of the present disclosure. One or more aspects of the method 1100 may be implemented in conjunction with device 105 of FIG. 1, apparatus 205 of FIG. 2, and/or debug module 130 depicted in FIGS. 1, 2, and/or 3. In some examples, a backend server, computing device, and/or storage device may execute one or more sets of codes to control the functional elements of the backend server, computing device, and/or storage device to perform one or more of the functions described below. Additionally or alternatively, the backend server, computing device, and/or storage device may perform one or more of the functions described below using special-purpose hardware.

At block 1105, the method 1100 may include selecting a period of a timer tick for one or more sub-systems of the system. At block 1110, the method 1100 may include comparing a current state of the one or more sub-systems to a previous state of the one or more sub-systems. At block 1115, the method 1100 may include generating an output indicating whether the current and previous states remain unchanged after a time of at least two timer ticks. In some cases, generating the output may be based on two inputs. For example, a result from a first comparator may be received as a first input, a pulse based on the selected period of the timer tick may be received as a second input, and based on the first and second inputs the output may be generated.

The operation(s) at block 1105-1115 may be performed using the debug module 130 described with reference to FIGS. 1-3 and/or another module. Thus, the method 1100 may provide for improving system debugging using finite state machines. It should be noted that the method 1100 is just one implementation and that the operations of the method 1100 may be rearranged, omitted, and/or otherwise modified such that other implementations are possible and contemplated.

Figure 12:
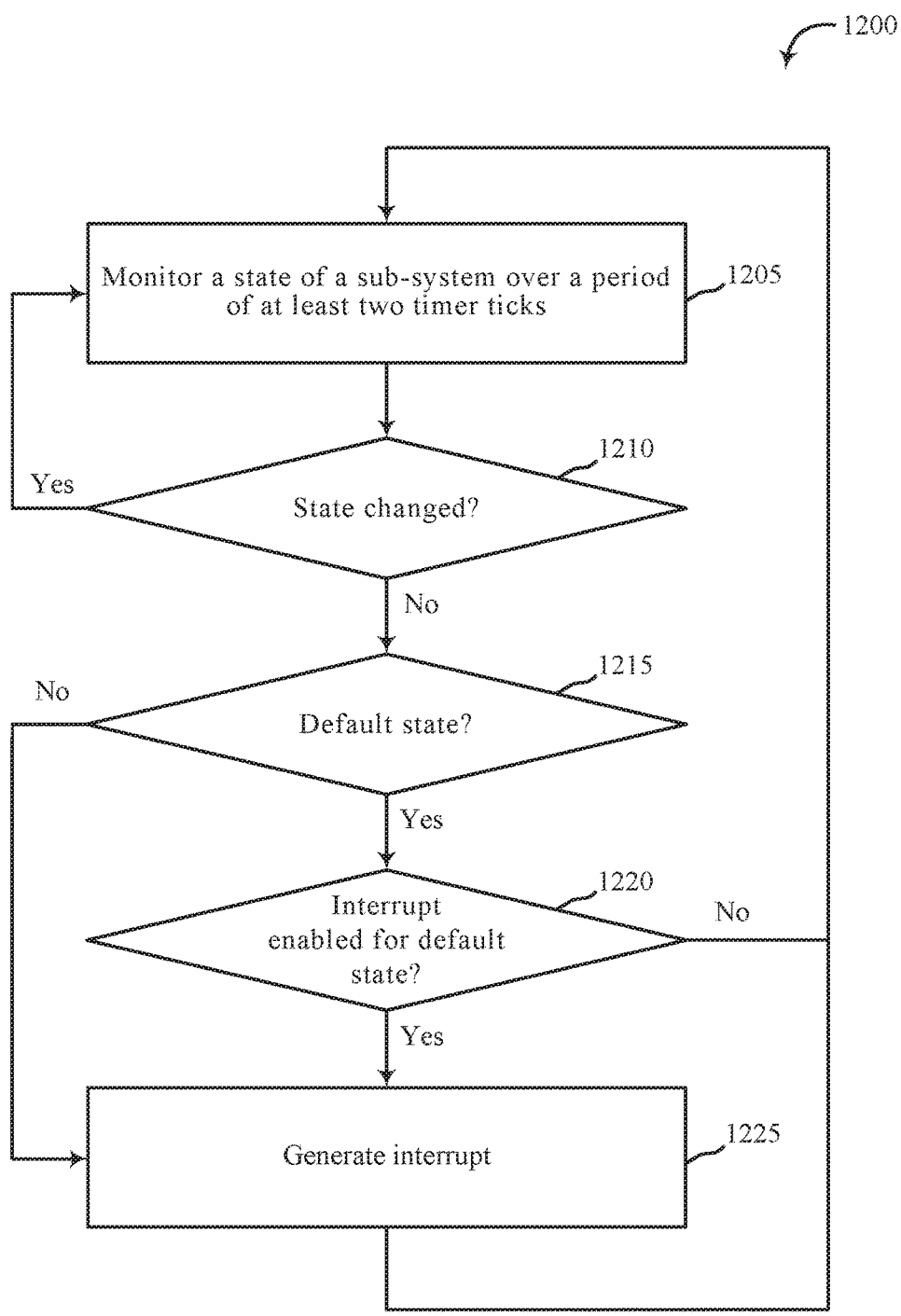
FIG. 12 is a flow chart illustrating an example of a method in accordance with various aspects of this disclosure.

FIG. 12 is a flow chart illustrating an example of a method 1200 for improving system debugging using finite state machines, in accordance with various aspects of the present disclosure. One or more aspects of the method 1200 may be implemented in conjunction with device 105 of FIG. 1, apparatus 205 of FIG. 2, and/or debug module 130 depicted in FIGS. 1, 2, and/or 3. In some examples, a backend server, computing device, and/or storage device may execute one or more sets of codes to control the functional elements of the backend server, computing device, and/or storage device to perform one or more of the functions described below. Additionally or alternatively, the backend server, computing device, and/or storage device may perform one or more of the functions described below using special-purpose hardware.

At block 1205, the method 1200 may include monitoring a state of a sub-system of a system over a period of at least two timer ticks. In some cases, the sub-system being monitored may be a sub-system monitored continuously. Additionally, or alternatively, the sub-system being monitored may be selected from among multiple sub-systems where a sub-system is monitored one selected sub-system at a time. Additionally, or alternatively, the sub-system being monitored may be selected from data sent over a debug bus. In some cases, the sub-system being monitored may be selected from multiple hardware and/or software sub-systems.

At block 1210, the method 1200 may include determining whether a state of the sub-system being monitored changes after at least two timer ticks elapse. If the method 1200 determines the state of the sub-system being monitored changes after at least two timer ticks elapse, then the method 1200 will continue monitoring the state of the sub-system at block 1205. On the other hand, if the method 1200 determines that the sub-system being monitored does not change, but remains in the same state after at least two timer ticks elapse, then the method 1200 may proceed to block 1215.

At block 1215, the method 1200 may include determining whether the sub-system being monitored is in a default state over the period of the at least two timer ticks. If at block 1215 the method 1200 determines the state of the sub-system being monitored is in the default state over the period of the at least two timer ticks, then the method 1200 may proceed to block 1220. On the other hand, if at block 1215 the method 1200 determines that the sub-system being monitored is not in the default state over the period of the at least two timer ticks, then the method 1200 may proceed to block 1225.

At block 1220, the method 1200 may include determining whether the interrupt is enabled for the sub-system being in the default state over the period of the at least two timer ticks. For example, at block 1220 the method 1200 may determine whether the interrupt enable bit is set for the sub-system being in the default state over the period of the at least two timer ticks. If at block 1220 the method 1200 determines the interrupt is enabled for the default state, the method 1200 may proceed to block 1225. On the other hand, if at block 1220 the method 1200 determines that the interrupt is not enabled for the default state, then the method 1200 may proceed back to block 1205.

At block 1225, the method 1200 may include generating an interrupt. In some cases, at block 1225 the method 1200 will generate an interrupt when the sub-system being monitored remains in the same state, other than the default state, over the period of the at least two timer ticks. Alternatively, in some cases, at block 1225 the method 1200 will generate an interrupt when the sub-system remains in any state over the period of at least two timer ticks. In some cases, the method 1200 will send the interrupt to a processor of the system. As part of the method 1200, the processor may process the interrupt to determine that the sub-system being monitored is in a hung state. Upon determining the sub-system being monitored is in a hung state, the processor may generate a notification identifying the sub-system being monitored and indicating the identified sub-system appears to be in a hung state. In some embodiments, upon generating an interrupt, the method 1200 returns to block 1205.

The operations at blocks 1205-1225 may be performed using the debug module 130 described with reference to FIGS. 1-3 and/or another module. Thus, the method 1200 may provide for improving system debugging using finite state machines. It should be noted that the method 1200 is just one implementation and that the operations of the method 1200 may be rearranged, omitted, and/or otherwise modified such that other implementations are possible and contemplated.

In some examples, aspects from two or more of the methods 1100 and 1200 may be combined and/or separated. It should be noted that the methods 1100 and 1200 are just example implementations, and that the operations of the methods 1100 and 1200 may be rearranged or otherwise modified such that other implementations are possible.

The detailed description set forth above in connection with the appended drawings describes examples and does not represent the only instances that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with this disclosure may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, and/or state machine. A processor may also be implemented as a combination of computing devices, e.g., a combination of a DSP and a microprocessor, multiple microprocessors, one or more microprocessors in conjunction with a DSP core, and/or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (e.g., A and B and C).

In addition, any disclosure of components contained within other components or separate from other components should be considered exemplary because multiple other architectures may potentially be implemented to achieve the same functionality, including incorporating all, most, and/or some elements as part of one or more unitary structures and/or separate structures.

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM, DVD, or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, or any combination thereof, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed.

This disclosure may specifically apply to security system applications. This disclosure may specifically apply to storage system applications. In some embodiments, the concepts, the technical descriptions, the features, the methods, the ideas, and/or the descriptions may specifically apply to storage and/or data security system applications. Distinct advantages of such systems for these specific applications are apparent from this disclosure.

The process parameters, actions, and steps described and/or illustrated in this disclosure are given by way of example only and can be varied as desired. For example, while the steps illustrated and/or described may be shown or discussed in a particular order, these steps do not necessarily need to be performed in the order illustrated or discussed. The various exemplary methods described and/or illustrated here may also omit one or more of the steps described or illustrated here or include additional steps in addition to those disclosed.

Furthermore, while various embodiments have been described and/or illustrated here in the context of fully functional computing systems, one or more of these exemplary embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. In some embodiments, these software modules may permit and/or instruct a computing system to perform one or more of the exemplary embodiments disclosed here.

This description, for purposes of explanation, has been described with reference to specific embodiments. The illustrative discussions above, however, are not intended to be exhaustive or limit the present systems and methods to the precise forms discussed. Many modifications and variations are possible in view of the above teachings. The embodiments were chosen and described in order to explain the principles of the present systems and methods and their practical applications, to enable others skilled in the art to utilize the present systems, apparatus, and methods and various embodiments with various modifications as may be suited to the particular use contemplated.

What is claimed is:

1. A system comprising:
a first multiplexer to select a period of a timer tick for one or more sub-systems of the system;
a first comparator to compare a current state of the one or more sub-systems to a previous state of the one or more sub-systems; and
a finite state machine (FSM) to receive a result from the first comparator as a first input, receive a pulse based on the selected period of the timer tick from the first multiplexer as a second input, and based on the first and second inputs generate an output indicating whether the current and previous states remain unchanged after a time of at least two timer ticks.

2. The system of claim 1, comprising:
a second comparator to compare a last state of the one or more sub-systems to a default state of the one or more sub-systems, the result from the first comparator indicating whether the current state equals the previous state of the one or more sub-systems, the result from the second comparator indicating whether the current state equals the default state of the one or more sub-systems.

3. The system of claim 2, comprising:
an OR gate to receive a result of the second comparator and a default state setting, the default state setting indicating whether to trigger an interrupt for the default state.

4. The system of claim 3, comprising:
a third comparator to compare the output from the FSM to a result of the OR gate, the result from the OR gate indicating whether to trigger an interrupt when the current state remains in the default state for at least two periods of the timer tick.

5. The system of claim 4, comprising:
a processor of the system to receive a result from the third comparator and generate an interrupt when the result from the third comparator indicates a state of the one or more sub-systems remains unchanged for at least two periods of the timer tick, the interrupt identifying a specific sub-system from the system.

6. The system of claim 1, comprising:
a second multiplexer to receive multiple state vectors and select a first state vector of a first sub-system from the system, each of the multiple state vectors being associated with a different sub-system from the one or more sub-systems, wherein the first multiplexer or the second multiplexer, or both, are configured to receive multiple inputs and select one of the multiple inputs as an output; and a synchronizer to synchronize the multiple state vectors to a fastest clock of the one or more sub-systems.

7. The system of claim 6, comprising:
an AND gate to mask the first state vector with a first mask value and provide to the first comparator the masked first state vector as a current state of the first sub-system.

8. The system of claim 1, comprising:
a control register to select a second state vector from a system debug bus; and
an AND gate to mask the second state vector with a second mask value and provide to the first comparator the masked second state vector as a current state of a second sub-system from the system.

9. The system of claim 1, comprising:
control logic to identify a state variable being written to at least one of data memory and a scratch register, the state variable being associated with a software based state machine.

10. The system of claim 9, comprising:
an AND gate to mask the identified state variable with a third mask value and provide to the first comparator the masked state variable as a current state of the software based state machine.

11. An apparatus comprising:
a first multiplexer to select a period of a timer tick for one or more blocks of a system on a chip (SoC);
a first comparator to compare a current state of the one or more blocks to a previous state of the one or more blocks, a result from the first comparator indicating whether the current state equals the previous state of the one or more blocks;
a finite state machine (FSM) to receive the result from the first comparator as a first input, receive a pulse based on the selected period of the timer tick from the first multiplexer as a second input, and based on the first and second inputs generate an output indicating whether the current and previous states remain unchanged after a time of at least two timer ticks.

12. The apparatus of claim 11, comprising:
a second comparator to compare a last state of the one or more blocks to a default state of the one or more blocks, the result from the second comparator indicating whether the current state equals the default state of the one or more blocks.

13. The apparatus of claim 12, comprising:
an OR gate to receive a result of the second comparator and a default state setting, the default state setting indicating whether to trigger an interrupt for the default state.

14. The apparatus of claim 13, comprising:
a third comparator to compare the output from the FSM to a result of the OR gate, the result from the OR gate indicating whether to trigger an interrupt when the current state remains in the default state for at least two periods of the timer tick.

15. The apparatus of claim 14, comprising:
a processor of the system to receive a result from the third comparator and generate an interrupt when the result from the third comparator indicates a state of the one or more sub-systems remains unchanged for at least two periods of the timer tick, the interrupt identifying a specific sub-system from the system.

16. The apparatus of claim 11, comprising:
a second multiplexer to receive multiple state vectors and select a first state vector of a first sub-system from the system, each of the multiple state vectors being associated with a different sub-system from the one or more sub-systems, wherein the first multiplexer or the second multiplexer, or both, are configured to receive multiple inputs and select one of the multiple inputs as an output; and
a synchronizer to synchronize the multiple state vectors to a fastest clock of the one or more sub-systems.

17. The apparatus of claim 16, comprising:
an AND gate to mask the first state vector with a first mask value and provide to the first comparator the masked first state vector as a current state of the first sub-system.

18. The apparatus of claim 11, comprising:
a control register to select a second state vector from a system debug bus; and
an AND gate to mask the second state vector with a second mask value and provide to the first comparator the masked second state vector as a current state of a second sub-system from the system.

19. A method comprising:
selecting, by a first multiplexer, a period of a timer tick for one or more blocks of a system on a chip (SoC);
comparing, by a first comparator, a current state of the one or more blocks to a previous state of the one or more blocks, a result from the first comparator indicating whether the current state equals the previous state of the one or more blocks;
receiving, by a finite state machine (FSM), the result from the first comparator as a first input, receive a pulse based on the selected period of the timer tick from the first multiplexer as a second input, and based on the first and second inputs generate an output indicating whether the current and previous states remain unchanged after a time of at least two timer ticks.

20. The method of claim 19, comprising:
comparing, by a second comparator, a last state of the one or more blocks to a default state of the one or more blocks, the result from the second comparator indicating whether the current state equals the default state of the one or more blocks.

* * * * *